United States Patent
Brennan et al.

(10) Patent No.: US 7,214,568 B2
(45) Date of Patent: May 8, 2007

(54) SEMICONDUCTOR DEVICE CONFIGURED FOR REDUCING POST-FABRICATION DAMAGE

(75) Inventors: John M. Brennan, Wyomissing, PA (US); Joseph Michael Freund, Fogelsville, PA (US); Sujal Dipak Shah, Fogelsville, PA (US); Richard Handly Shanaman, III, Richland, PA (US)

(73) Assignee: Agere Systems Inc., Allentown, PA (US)

( * ) Notice: Subject to any disclaimer, the term of this patent is extended or adjusted under 35 U.S.C. 154(b) by 46 days.

(21) Appl. No.: 10/773,614

(22) Filed: Feb. 6, 2004

(65) Prior Publication Data

US 2005/0173024 A1    Aug. 11, 2005

(51) Int. Cl.
*H01L 21/00* (2006.01)
(52) U.S. Cl. ............................... 438/113; 257/E21.705
(58) Field of Classification Search ........ 438/106–126, 438/33, 68; 257/666–672, E21.705
See application file for complete search history.

(56) References Cited

U.S. PATENT DOCUMENTS

| | | | |
|---|---|---|---|
| 4,961,821 A | * | 10/1990 | Drake et al. ................... 438/21 |
| 5,516,125 A | | 5/1996 | McKenna |
| 6,271,102 B1 | * | 8/2001 | Brouillette et al. ......... 438/462 |
| 2003/0025183 A1 | * | 2/2003 | Thornton et al. ........... 257/666 |
| 2003/0122238 A1 | * | 7/2003 | Wu et al. .................... 257/686 |

* cited by examiner

*Primary Examiner*—Brook Kebede

(57) ABSTRACT

A semiconductor device includes an IC die configured to reduce post-fabrication damage to the device. The IC die is formed such that at least a portion of one or more perimeter edges of the die are beveled by an etching process. The semiconductor device may include a plurality of IC dies, at least one of the IC dies being separated from the semiconductor device by forming one or more v-shaped grooves in an upper surface of the device, the v-shaped grooves defining perimeter edges of the at least one IC die. A back surface of the semiconductor device is removed until at least a portion of the v-shaped grooves are exposed. When the IC die is separated from the semiconductor device in this manner, a sidewall of each of the v-shaped grooves forms a beveled perimeter edge of the separated IC die.

23 Claims, 4 Drawing Sheets

SEMICONDUCTOR DEVICE CONFIGURED FOR REDUCING POST-FABRICATION DAMAGE

FIELD OF THE INVENTION

The present invention relates generally to semiconductor devices, and more particularly relates to techniques for forming a semiconductor device that is configured so as to reduce post-fabrication damage.

BACKGROUND OF THE INVENTION

The process of mounting a semiconductor die to a substrate or package is generally known as die attach. Eutectic die attach, also referred to as eutectic bonding, which is commonly employed in hermetic integrated circuit (IC) packages, typically uses a eutectic alloy to attach the semiconductor die to a package cavity. A eutectic alloy is an alloy with the lowest melting point possible for the metals combined in the alloy. One of the most commonly used die attach alloys in semiconductor packaging is a gold-silicon (Au—Si) alloy.

During a conventional eutectic die attach process, a gold preform is placed on top of the package cavity while the package is being heated. When the die is mounted over the preform, silicon from the backside of the die diffuses into the gold preform, forming a gold-silicon alloy composition. As more silicon diffuses into the preform, the ratio of silicon to gold increases, until a eutectic ratio is achieved. The Au—Si alloy has about 97 percent gold and about 3 percent silicon and has a melting point of around 363 degrees Celsius. In order to achieve the eutectic melting point, the die attach temperature must be reasonably higher than this temperature. To optimize the die attachment, a "scrubbing" of the die into the eutectic alloy is typically performed. This scrubbing action helps ensure good wetting of the die and the package cavity for even distribution of the die attach alloy so as to achieve a substantially void-free bond.

In order to hold the die during the die attach process, a pickup tool, usually a die collet, is used. Four-sided collets are often referred to as pyramidal die collets, or "inverted pyramids," and two-sided collets are often referred to as "channel" collets. In either case, the slanted sides of the collet contact the silicon die along the sawed perimeter edge of the die. The sawing process typically produces chip-out damage to the edges of the die, and when coupled with the scrubbing and/or normal force of the die attach process, additional cracking of the silicon die often occurs. For ultra-thin (e.g., about 50 microns or less) die applications, such as, but not limited to, radio frequency (RF) power devices, a yield loss resulting from one or more of these damage modes can be significant.

One known approach to minimize the potential for damaging the semiconductor die during die attach is to reduce an angle of the slanted sides of the collet. In making the sides of the collet a shallower angle, however, the die will not be captured as well, therefore causing the die to shift during the scrubbing process. The shifting of the die will undesirably affect the final placement accuracy of the die. For certain semiconductor devices, such as, for example, RF power devices, die placement accuracy is crucial for repeatable RF performance.

With regard to wafer sawing, one known technique for minimizing damage to the die resulting from the sawing process is to employ a scribe and cleave process. Scribe and cleave is a two-step process, however, and any improvements in die edge damage achieved from this alternative process are generally not sufficient to overcome the drop in throughput compared to sawing.

In U.S. Pat. No. 5,516,125 to McKenna, which is directed to an improved collet for vacuum pick-up of a semiconductor die, an embodiment is described which is suitable for use with a die having beveled perimeter edges. McKenna further describes one type of beveled edge die in which the die boundaries of an entire wafer are sawn with a partial v-shaped saw down to a specified depth, followed by a cleave process to separate the individual die. However, as previously stated, the wafer sawing process typically produces considerable chip-out damage to the edges of the die and is thus undesirable.

There exists a need, therefore, for an improved semiconductor device that does not suffer from one or more of the problems attributable to the use of conventional wafer sawing and/or die attachment methodologies.

SUMMARY OF THE INVENTION

The present invention meets the above-noted need by providing, in an illustrative embodiment, improved techniques for beneficially reducing damage to a semiconductor device which can otherwise occur during post-fabrication processing of the device, for example, during wafer sawing and/or die attachment.

In accordance with one aspect of the invention, a semiconductor device includes an IC die. The IC die is formed such that at least a portion of at least one perimeter edge of the die is beveled by using an etching process.

In accordance with another aspect of the invention, the semiconductor device further includes a plurality of IC dies, at least one of the IC dies being separated from the semiconductor device by forming one or more v-shaped grooves (v-grooves) in an upper surface of the device and at least partially through the device, the v-grooves defining perimeter edges of the at least one IC die. A back surface of the semiconductor device opposite the upper surface of the device is removed until at least a portion of the v-grooves are exposed. When the IC die is separated from the semiconductor device in this manner, a sidewall of each of the v-grooves forms a beveled perimeter edge of the separated die.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative semiconductor device including an IC die formed by beveling at least a portion of one or more peripheral edges of the die. It should be understood, however, that the present invention is not limited to this or any particular semiconductor device arrangement. Rather, the invention is more generally applicable to techniques for advantageously reducing the amount of post-fabrication damage to an IC die, such as, for example, damage resulting from wafer sawing and/or die attachment.

The term "post-fabrication processing" as used herein is intended to refer to processing steps performed on a semiconductor die or associated wafer subsequent to the formation of patterned integrated circuit regions in the wafer. Post-fabrication processing may include, but is not limited to, wafer sawing, scribe and cleave, die attach, IC packaging, wire bonding, etc., as will be understood by those skilled in the art.

Figure 1A:
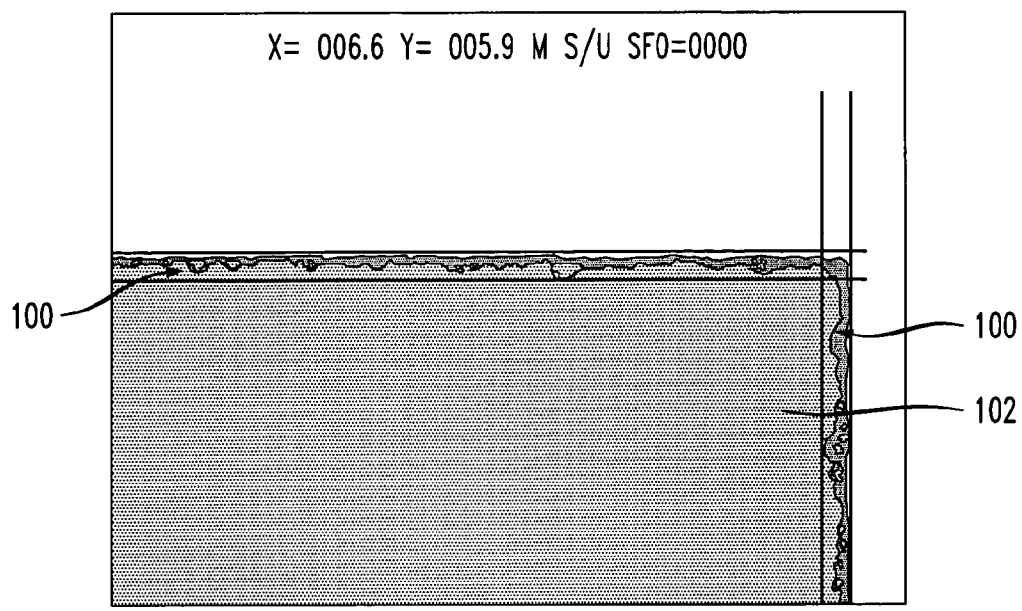
FIG. 1A is a top plan view illustrating of an upper right corner of an exemplary IC die depicting chip-out damage to the die.
Figure 1B:
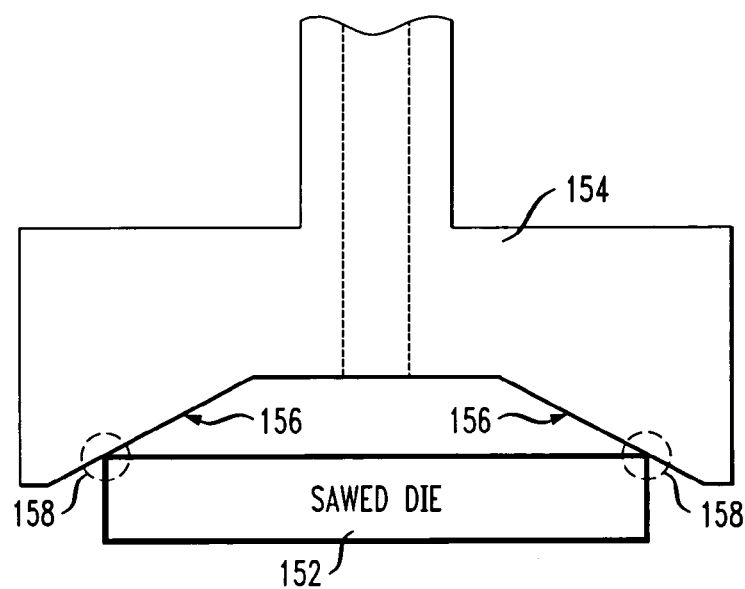
FIG. 1B is a side view of an illustrative die collet contacting a sawed semiconductor die.

As previously stated, an IC die generally experiences a number of stress and/or damage modes in the course of post-fabrication processing. For example, wafer sawing, as may be used to separate a given semiconductor wafer into a plurality of individual dies (also referred to as die singulation), typically produces about three or more microns of surface damage (e.g., chip-out damage) to the edges of a two thousandths of an inch (2 mil) thick die. For thinner dies (e.g., about 50 microns or less), as may be used for fabricating RF power devices, even more chip-out damage can occur. FIG. 1A depicts an upper right corner of an exemplary semiconductor die 102 showing chip out damage areas 100 to the peripheral edges of the die as a result of wafer sawing. Additional damage (e.g., cracking, chipping, etc.) often occurs during the die attach process. As shown in FIG. 1B, during die attach, a die collet 154 contacts the semiconductor die 152 along one or more sawed perimeter edges of the die, primarily at the angled sidewalls 156 of the collet. Scrubbing and normal forces bear down on the die 152 creating high stress points, particularly at the corner 158 of the die.

Figure 2:
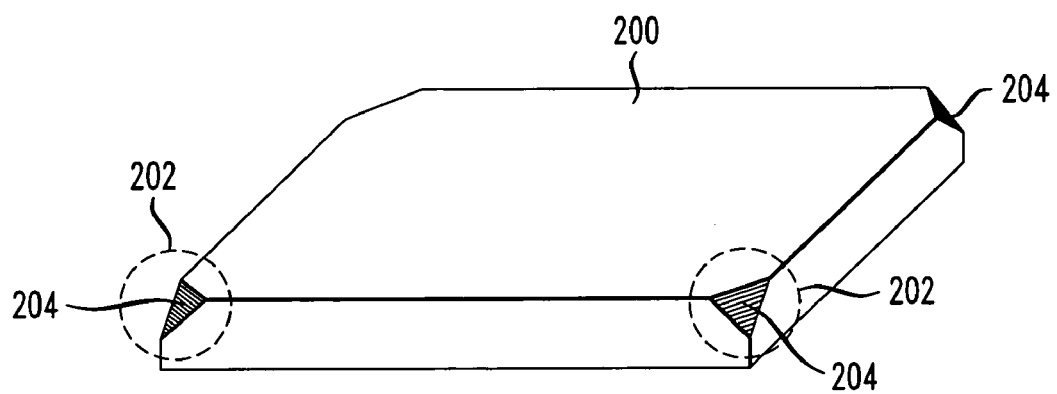
FIG. 2 is a perspective view illustrating an exemplary IC die having beveled corners, formed in accordance with one embodiment of the present invention.

FIG. 2 is a perspective view depicting an exemplary IC die 200, formed in accordance with an illustrative embodiment of the invention. The techniques of the present invention, as described herein, provide a means for beneficially reducing post-fabrication surface damage to an IC die. As apparent from the figure, at least one or more corner 202 of the exemplary IC die 200 preferably comprise a beveled surface 204 formed using an etching process, such as, but not limited to, wet etching (e.g., anisotropic etching), reactive ion etching (RIE), etc.

While it may be known to form an IC die having beveled perimeter edges, conventional methodologies for forming the beveled surface involve sawing the die boundaries of an entire wafer with a partial v-shaped saw down to a specified depth, followed by a cleave process to separate the individual die. As previously explained, however, the wafer sawing process typically produces substantial chip-out damage to the edges of the die and is thus undesirable. Additionally, like scribe and cleave, sawing followed by cleave is at least a two-step process which generally cannot achieve an ample reduction in die edge damage to justify the drop in throughput associated therewith. Moreover, the conventional approach essentially does not allow selective control over the beveling process, and therefore the entire length of all perimeter edges of the die will be beveled.

In a preferred embodiment of the invention, anisotropic etching is employed to form the beveled portion or portions of the IC die. Anisotropic etching is a well known technique which can be used to form v-grooves in a semiconductor wafer. The anisotropy of the etching stems from the inherent crystalline structure of the silicon wafer. In silicon, atoms lying predominantly on <111> oriented planes appear more densely packed than those lying on <110> or <100> planes. As a consequence, certain etchants are favored in removing atoms from the <110> and <100> planes. The different etching rates that selected etchants exhibit against the different crystalline planes results in the formation of well-defined v-grooves in the wafer where unprotected silicon is exposed to the etchant. A common anisotropic wet etchant may comprise, for example, potassium hydroxide (KOH), tetramethyl amonium hydroxide (TMAH), etc.

While the formation of v-grooves in an active circuit portion of a wafer may be known in the general sense, such as, for example, as may be used to form substrate connections and isolation trenches, the use of v-groove etching (e.g., in a scribe channel or street) in order to define the dimensions of a given IC die as part of a die separation process is not known.

The beveled surface 204 of a given corner 202 may be formed by etching at least a portion of the corner at a certain angle, such as, for example, about 45 degrees. Other angles could also be used. The angle at which a given portion of the IC die is etched may be selectively controlled, for example, by varying one or more characteristics of the etching process, such as, but not limited to, the type of etchant used, temperature, duration of etching, etc. The beveled portion or portions of the IC die 200 can be precisely controlled by selectively patterning an upper surface of the die, for example, by using a standard photolithographic process, with a protective layer (e.g., photoresist). Areas of the IC die that are not covered with the protective layer will be at least partially etched away during the etching process.

Primary stress points associated with the IC die 200 exist at the corner 202 of the die, as previously explained. By beveling one or more corner 202 of the die in accordance with the invention, the scrubbing and/or normal forces (e.g., during the die attach process), which would otherwise be concentrated on the sharp corner of the die, are distributed over the entire beveled surface of the corner. Thus, a significant reduction in post-fabrication surface damage to the IC die can be achieved using the techniques of the present invention. It is to be understood that the invention is not limited to a specific angle at which a face of each of the one or more corner of the die are beveled. Moreover, it is not a requirement of the invention that all corner of the die, assuming more than one corner is beveled, be beveled at the same angle.

Figure 3:
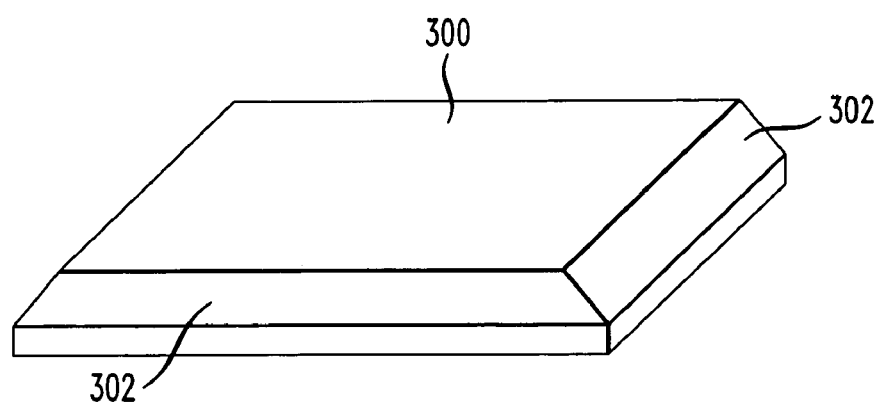
FIG. 3 is a perspective view illustrating an exemplary IC die having beveled perimeter edges, formed in accordance with another embodiment of the invention.

FIG. 3 is a perspective view illustrating an exemplary IC die 300, formed in accordance with another embodiment of the invention. In this embodiment, one or more perimeter edges 302 of the exemplary IC die 300 are beveled. A die formed in this manner may be able to achieve a further beneficial reduction in post-fabrication damage. As in the embodiment shown in FIG. 2, the invention is not limited to a specific angle at which each of the one or more perimeter edges 302 of the IC die 300 are beveled. Moreover, it is not a requirement that all perimeter edges of the die, assuming more than one perimeter edge is beveled, be beveled at the same angle.

In the case where only a portion of a given perimeter edge 302 is beveled, the beveled surface need not be restricted to a corner joining two adjacent edges, as depicted in FIG. 2. Rather, it is contemplated that one or more portions of a given perimeter edge 302 may be beveled at any point along the edge, as will be understood by those skilled in the art, and a beneficial reduction in post-fabrication damage to the IC die 300 will be achievable.

In a preferred embodiment of the invention, the etch process is performed on at least a portion of a semiconductor wafer and replaces and/or supplements the use of sawing to singulate the wafer into one or more IC die associated therewith. When the etch process is used solely to singulate the wafer, post-fabrication damage caused by wafer sawing is beneficially eliminated. Alternatively, when etching is used in conjunction with wafer sawing, post-fabrication damage can be advantageously reduced. Due to the nature of the anisotropic etch, the v-groove angle dimensions, and thus the angle of the beveled perimeter edges of the IC die, can be precisely controlled and are therefore highly repeatable. This is advantageous when forming, for example, RF power devices. Additionally, the surfaces of the sidewalls of the v-grooves formed as a result of the etching process will have a substantially smooth, mirror-like characteristic. In this manner, a semiconductor wafer can be singulated into a plurality of dies without the use of wafer sawing or alternative means (e.g., scribe and cleave), and with all of the IC dies having substantially the same precisely beveled perimeter edges.

Figure 4:
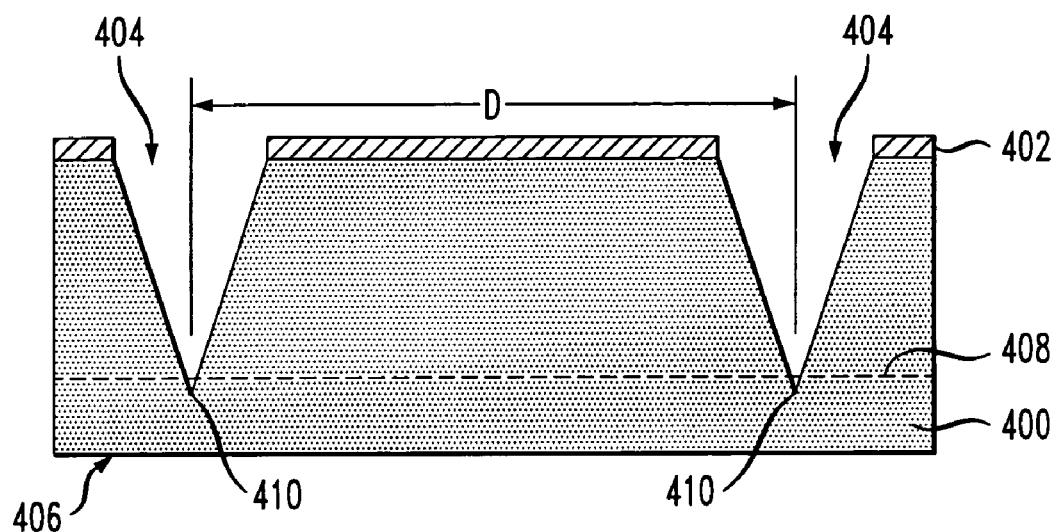
FIG. 4 is a cross-sectional view depicting at least a first step in an exemplary semiconductor fabrication process which may be used for forming an IC die having beveled perimeter edges, in accordance with one aspect of the invention.
Figure 5:
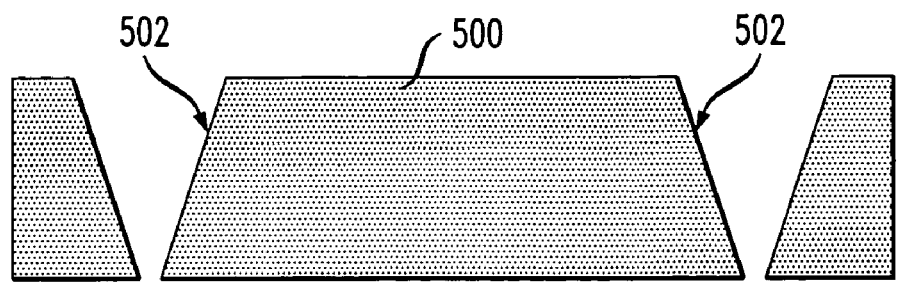
FIG. 5 is a cross-sectional view depicting at least a second step in an exemplary semiconductor fabrication process which may be used for forming an IC die having beveled perimeter edges, in accordance with the invention.

FIGS. 4 and 5 depict exemplary steps in a semiconductor fabrication process in which the techniques of the present invention are implemented. As shown in FIG. 4, subsequent to performing topside processing to form integrated circuit portions on a semiconductor wafer 400, an etch resist layer 402, or alternative protective layer, is preferably formed on an upper surface of the wafer, such as, for example, using a conventional photolithographic patterning process, to define separation streets. The etch resist layer 402 may comprise, for example, silicon nitride, although alternative materials that are substantially non-reactive with respect to the etchant may be similarly employed. Anisotropic etching is used to form a pattern of v-grooves 404 in the separation streets which define the die dimensions D on the wafer. A back surface 406 of the wafer, opposite the upper surface of the wafer, is then removed until the die are separated from the wafer. The die may be separated, for example, by backside grinding the wafer 400 until valleys 410 of the v-grooves 404 are at least partially exposed at a distance 408 from the back surface 406 of the wafer. It is to be appreciated that alternative means (e.g., backside etching, etc.) may be used to singulate the wafer at the v-groove valleys.

FIG. 5 illustrates an IC die 500 that has been separated from the wafer using the techniques of the present invention. As apparent from the figure, the angled sidewalls 502 of the v-grooves advantageously form the beveled perimeter edges of the IC die 500.

Figure 6:
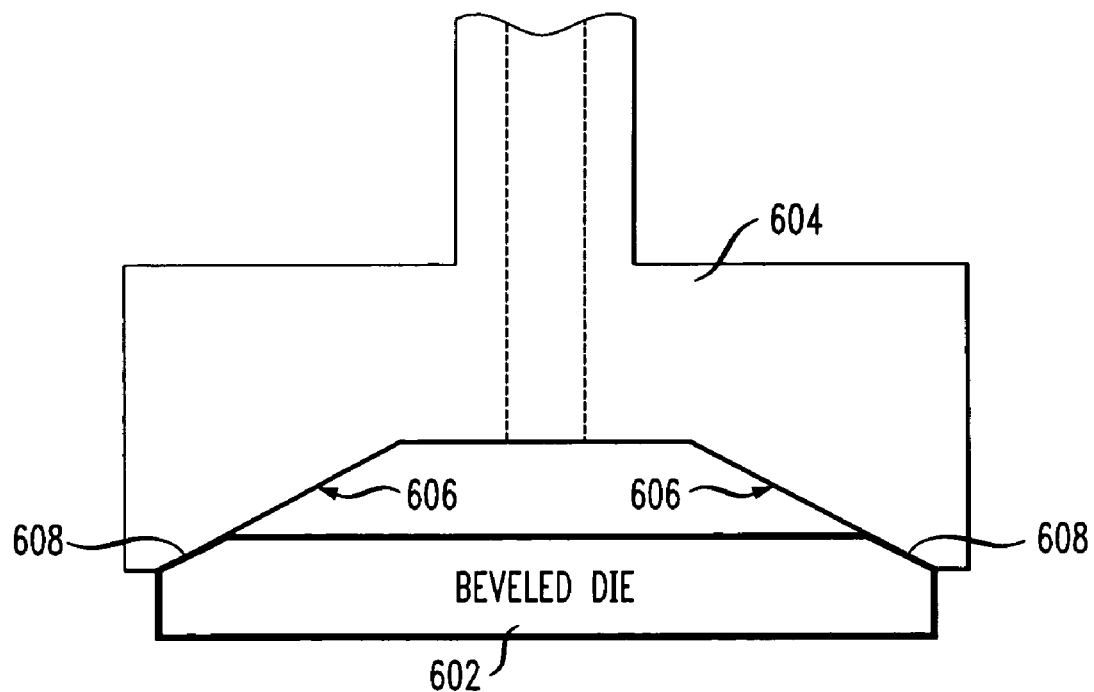
FIG. 6 is a side view of an illustrative die attach collet having angled sidewalls configured to match a bevel angle of the perimeter edges of the exemplary IC die shown in FIG. 3.

As previously explained, using anisotropic etching, the angle of the v-grooves forming the beveled perimeter edges of the IC die can be precisely controlled. In accordance with a preferred embodiment of the invention, as shown in FIG. 6, the beveled angle of two or more perimeter edges 608 of an exemplary IC die 602 are substantially matched to the angled sidewalls 606 of a die attach collet 604 which is configurable for receiving the IC die. When employing a four-sided die collet, all four beveled perimeter edges 608 of the IC die 602 are preferably configured to substantially match the angled sidewalls 608 of the collet. Likewise, when employing a two-sided die collet, only two beveled perimeter edges of the IC die may be substantially matched to the angled sidewalls of the collet.

In the embodiment shown in FIG. 2, wherein only a portion of one or more perimeter edges of the exemplary IC die are beveled (e.g., one or more corner of the IC die), the beveled angle of the portion of the one or more perimeter edges may be substantially matched to the angled sidewalls of the die attach collet.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for separating at least one integrated circuit die from an associated semiconductor wafer, the method comprising the steps of:
forming one or more v-shaped grooves in an upper surface of the semiconductor wafer by an etching process, the one or more v-shaped grooves defining perimeter edges of the at least one integrated circuit die;
removing a back surface of the semiconductor wafer opposite the upper surface of the wafer until at least a portion of the one or more v-shaped grooves are exposed; and
forming at least one chamfer in the at least one integrated circuit die, the chamfer extending from a top surface of the integrated circuit die to an intersection of first and second adjacent sides of the at least one integrated circuit die, the chamfer having an upper surface which is angled relative to the first and second adjacent sides;
wherein a sidewall of each of the one or more v-grooves forms a beveled perimeter edge of the separated at least one integrated circuit die.

2. The method of claim 1, wherein the etching process comprises anisotropic etching.

3. The method of claim 1, further comprising the step of controlling an angle of at least one of the upper surface of the chamfer and the sidewall of at least one of the v-shaped grooves, at least in part, by selectively varying one or more characteristics of the etching process.

4. The method of claim 3, wherein the one or more characteristics of the etching process comprises at least one of a type of etchant, a temperature and a duration of etching.

5. A method for reducing post-fabrication surface damage to an integrated circuit die, the method comprising the step of forming at least one chamfer in the integrated circuit die using an etching process, the chamfer extending from a top surface of the integrated circuit die to an intersection of first and second adjacent sides of the integrated circuit die, the chamfer having an upper surface which is angled relative to the first and second adjacent sides, a first perimeter edge of the chamfer being formed by the first side of the integrated circuit die, a second perimeter edge of the chamfer being formed by the second side of the integrated circuit die, and a third perimeter edge of the chamfer being formed by an upper surface of the integrated circuit die, so that the upper surface of the chamfer is substantially triangular in shape.

6. The method of claim 5, further comprising the step of controlling an angle of the upper surface of the at least one chamfer by selectively varying one or more characteristics of the etching process.

7. The method of claim 5, wherein the step of forming the at least one chamfer comprises forming one or more v-shaped grooves in an upper surface of the integrated circuit die.

8. The method of claim 5, wherein the step of forming the at least one chamfer comprises the step of substantially matching the angle of the upper surface of the chamfer to an angle of at least one sidewall of a die collet configurable for receiving the die.

9. A packaged integrated circuit device, comprising:
at least one integrated circuit die, the at least one integrated circuit die having at least one chamfer extending from a top surface of the integrated circuit die to an intersection of first and second adjacent sides of the at least one integrated circuit die, the chamfer having an upper surface which is angled relative to the first and second adjacent sides, the chamfer being formed by an etching process;
wherein a first perimeter edge of the chamfer is formed by the first side of the integrated circuit die, a second perimeter edge of the chamfer is formed by the second side of the integrated circuit die, and a third perimeter edge of the chamfer is formed by an upper surface of the integrated circuit die, so that the upper surface of the chamfer is substantially triangular in shape.

10. The device of claim 9, wherein at least a portion of at least one perimeter edge of the at least one integrated circuit die is beveled by forming one or more v-shaped grooves in an upper surface of the at least one integrated circuit die.

11. The device of claim 9, wherein the angle of the upper surface of the chamfer in the at least one integrated circuit die is controlled, at least in part, by selectively varying one or more characteristics of the etching process.

12. A semiconductor device, comprising:
an integrated circuit die, the integrated circuit die having at least one chamfer joining first and second adjacent sides of the integrated circuit die, the chamfer having an upper surface which is angled relative to the first and second adjacent sides, the chamfer being formed by an etching process;
wherein a first perimeter edge of the chamfer is formed by the first side of the integrated circuit die, a second perimeter edge of the chamfer is formed by the second side of the integrated circuit die, and a third perimeter edge of the chamfer is formed by an upper surface of the integrated circuit die, so that the upper surface of the chamfer is substantially triangular in shape.

13. The device of claim 12, wherein the etching process comprises at least one of wet etching and reactive ion etching.

14. The device of claim 13, wherein the wet etching comprises anisotropic etching.

15. The device of claim 12, wherein at least a portion of at least one perimeter edge of the integrated circuit die is beveled by forming one or more v-shaped grooves in an upper surface of the device.

16. The device of claim 12, wherein the angle of the upper surface of the at least one chamfer in the integrated circuit die is controlled, at least in part, by selectively varying one or more characteristics of the etching process.

17. The device of claim 16, wherein the one or more characteristics of the etching process comprises at least one of a type of etchant, a temperature and a duration of etching.

18. The device of claim 12, further comprising a plurality of integrated circuit die, at least one of the integrated circuit die being separated from the semiconductor device by: (i) forming one or more v-shaped grooves in an upper surface of the device, the v-shaped grooves defining perimeter edges of the at least one integrated circuit die; and (ii) removing a back surface of the semiconductor device opposite the upper surface of the device until at least a portion of the v-grooves are exposed; wherein a sidewall of each of the v-shaped grooves forms a beveled perimeter edge of the separated die.

19. The device of claim 12, wherein the integrated circuit die comprises a plurality of chamfers, each of the chamfers joining a respective pair of adjacent sides of the integrated circuit die and having an upper surface which is angled relative to the respective pair of adjacent sides.

20. The device of claim 19, wherein the respective angles of the upper surfaces of the chamfers relative to corresponding pairs of adjacent sides of the integrated circuit die are substantially matched to one another.

21. The device of claim 12, wherein the angle of the upper surface of the at least one chamfer in the integrated circuit die is substantially matched to an angle of a sidewall of a die collet configurable for receiving the die.

22. The device of claim 12, wherein at least two perimeter edges of the integrated circuit die are beveled by the etching process.

23. The device of claim 12, wherein all perimeter edges of the integrated circuit die are beveled by the etching process.

* * * * *